United States Patent
Chen et al.

(10) Patent No.: US 7,219,046 B2
(45) Date of Patent: May 15, 2007

(54) CHARACTERIZING INPUT/OUTPUT MODELS

(75) Inventors: Zhaoqing Chen, Poughkeepsie, NY (US); Jan Elizabeth Garrett-Hoffman, Rochester, MN (US); Hubert Harrer, Schoenaich (DE); Stephen Bruce White, Minnesota City, MN (US)

(73) Assignee: International Business Machines Corporation, Armonk, NY (US)

( * ) Notice: Subject to any disclaimer, the term of this patent is extended or adjusted under 35 U.S.C. 154(b) by 537 days.

(21) Appl. No.: 10/732,952

(22) Filed: Dec. 11, 2003

(65) Prior Publication Data

US 2005/0131664 A1    Jun. 16, 2005

(51) Int. Cl.
*G06F 17/50* (2006.01)
(52) U.S. Cl. ............................................. 703/14; 716/5
(58) Field of Classification Search .................. 703/14, 703/15; 716/4, 5, 18
See application file for complete search history.

(56) References Cited

U.S. PATENT DOCUMENTS

| | | | | |
|---|---|---|---|---|
| 5,349,539 A | * | 9/1994 | Moriyasu ..................... | 703/15 |
| 5,404,496 A | * | 4/1995 | Burroughs et al. ........... | 714/28 |
| 5,452,227 A | * | 9/1995 | Kelsey et al. .................. | 716/3 |
| 5,933,356 A | * | 8/1999 | Rostoker et al. .............. | 703/15 |
| 6,044,211 A | * | 3/2000 | Jain ............................. | 716/18 |
| 6,697,980 B1 | * | 2/2004 | Glasser ....................... | 714/724 |

\* cited by examiner

*Primary Examiner*—Albert W. Paladini
(74) *Attorney, Agent, or Firm*—Owen J. Gamon

(57) ABSTRACT

A method, apparatus, system, and signal-bearing medium that in an embodiment select a simulator input fragment, characterize an I/O model using a set of simulator input fragments, create a set of behavioral models based on the characterization and compare the set of behavioral models to the I/O model. In an embodiment, the set of behavioral models is compared to the I/O model by creating simulator input decks that include net topology for the I/O model and the set of behavioral models, simulating the decks, and comparing the output from the simulating.

17 Claims, 4 Drawing Sheets

CHARACTERIZING INPUT/OUTPUT MODELS

FIELD

This invention generally relates to circuit design tools and more specifically relates to extracting I/O model parameters for a circuit.

BACKGROUND

The development of the EDVAC computer system of 1948 is often cited as the beginning of the computer era. Since that time, computer systems have evolved into extremely sophisticated devices, and computer systems may be found in many different settings. Computer systems typically include a combination of hardware (such as semiconductors, integrated circuits, programmable logic devices, programmable gate arrays, and circuit boards) and software, also known as computer programs.

The typical design methodology for integrated circuit designs—such as very large scale integrated (VLSI) circuits and application specific integrated circuits (ASICs)—is conventionally divided into the following three stages: first a design capture step is performed using, for example, a high level language synthesis package. Next, design verification is made on the resulting design. This includes simulations, timing analysis, and automatic test pattern generation (ATPG) tools. Finally, there is layout and eventual tape out of the device. The device is then tested, and the process may need to be reiterated one or more times until the desired design criteria are satisfied.

Currently, electronic design automation (EDA) tools are used to define and verify prototype systems. Conventional EDA tools provide computer-aided facilities for electronic engineers to define prototype designs, typically by generating either netlist files, which specify components and their interconnections, or hardware description files, which specify prototype system functionality according to a hardware description language (HDL).

Initially, the desired functionality for a circuit is analyzed by one or more designers. They define the logical components of the circuit and their interactions by specifying the logic design using design capture tools.

Two common methods for specifying the design are schematic capture and hardware description languages. Both of these methods allow a circuit designer to specify the circuit at the register transfer level. The schematic capture method provides a user interface, which allows a logic circuit to be drawn in graphical form on a computer display. Using this method, the circuit is defined as small building blocks, which can be used to develop higher level designs with increasing degrees of abstraction.

Encoding the design in a hardware description language (HDL) is the other major design entry technique used to specify modern integrated circuits. Hardware description languages are specially developed to aid a designer in describing a circuit. The HDL program specifying the design may be compiled into the same data format produced by schematic capture. This capability provides the designer great flexibility in methods used for specifying a logic design.

Next, it is necessary to verify that the logic definition is correct and that the circuit implements the function expected by the designers. Typically, this involves timing analysis and simulation tools. The data representation in the logic design database may be reformatted as needed prior to use by the timing analysis and simulation tools. The design undergoes design verification analysis in order to detect flaws in the design. The design is also analyzed by simulating the device resulting from the design to assess the functionality of the design. If errors are found or the resulting functionality is unacceptable, the designer modifies the design as needed. These design iterations help to ensure that the design satisfies its requirements.

Other verification methods include generating software models of the logic circuit design and testing the software model of the design with designer-specified test cases. Because it is not possible to check every possible condition that may be generated in the actual logic design, faulty logic may remain because it would not have been exercised by any of the test cases. Errors in the logic design may remain undetected until the release of a product on the marketplace, where it may cause costly redesigns.

Formal verification is another way to check logic design prior to the fabrication of a device. Formal verification is a technique wherein a logic circuit is modeled as a state transition system, and specifications are provided for components in the system. One way in which specifications may be made is through the use of logic formulas. Each of the components in the logic design is specified, and all possible behaviors of the design may be exercised by a tool which confirms that these specifications are met.

Once a netlist has been generated from the logic design, there are a number of commercially available silicon compilers, also called place and route tools, which are used to convert the netlist into a semiconductor circuit layout. The semiconductor circuit layout specifies the physical implementation of the circuit in silicon or other semiconductor materials.

As can be seen from the description above, the design verification step can be quite complicated and resource intensive. This complicated nature of design verification is exacerbated when a computer system contains hundreds of I/O (Input/Output) models that need to be characterized for simulation.

What is needed is a better way to handle the many I/O models that must be characterized for simulation.

SUMMARY

A method, apparatus, system, processor, and signal-bearing medium are provided that in an embodiment select a simulator input fragment, characterize an I/O model using the simulator input fragment, create a set of behavioral models based on the characterization and compare the set of behavioral models to the I/O model. In an embodiment, the set of behavioral models is compared to the I/O model by creating simulator input decks that include net topology for the I/O model and the set of behavioral models, simulating the decks, and comparing the output from the simulating.

DETAILED DESCRIPTION

Figure 1:
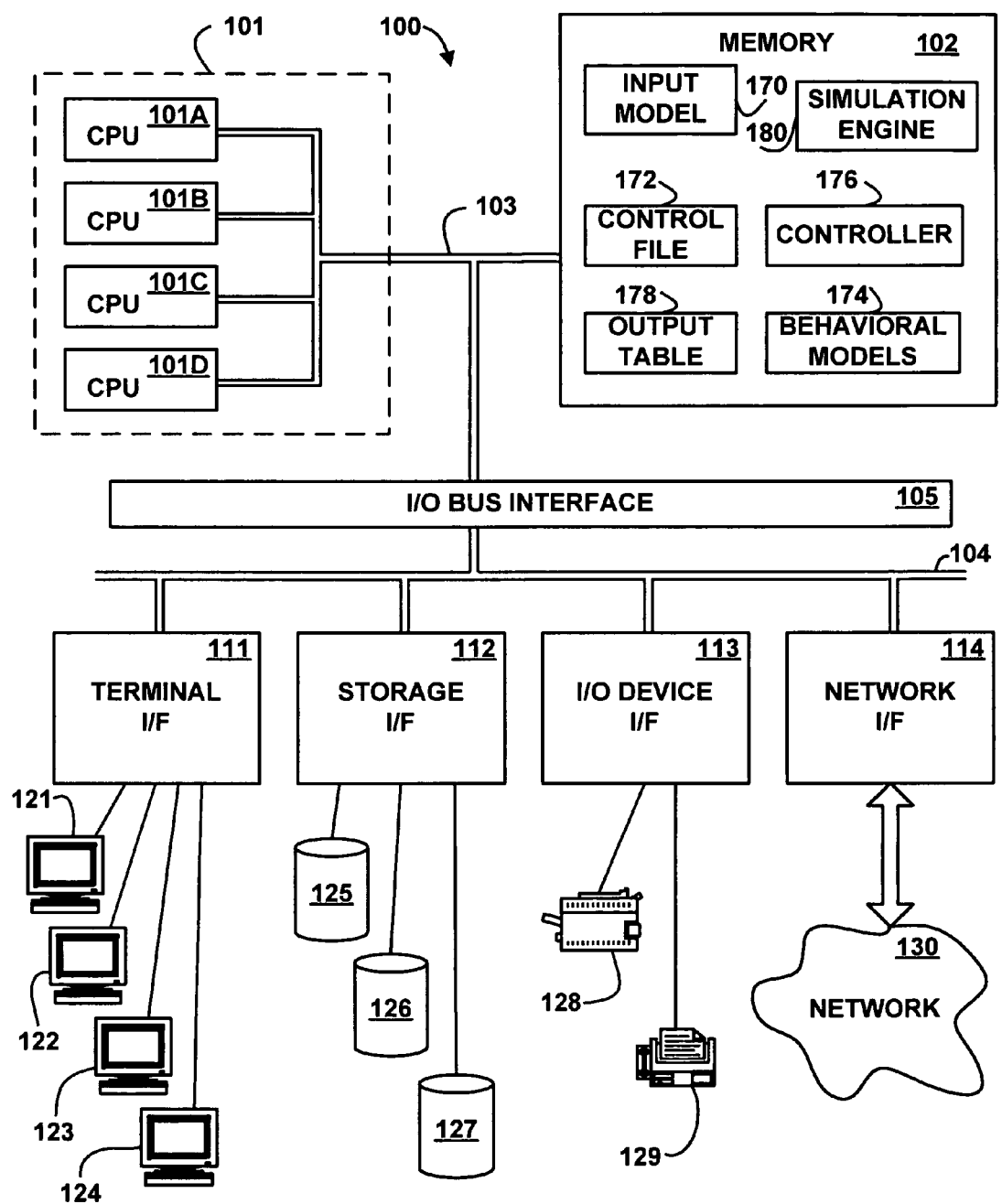
FIG. 1 depicts a high-level block diagram of a computer system, according to an embodiment of the present invention.

Referring to the Drawing, wherein like numbers denote like parts throughout the several views, FIG. 1 depicts a high-level block diagram representation of a computer system 100, according to an embodiment of the present invention. The major components of the computer system 100 include one or more processors 101, a main memory 102, a terminal interface 111, a storage interface 112, an I/O (Input/Output) device interface 113, and communications/network interfaces 114, all of which are coupled for inter-component communication via a memory bus 103, an I/O bus 104, and a bus interface 105.

The computer system 100 contains one or more general-purpose programmable central processing units (CPUs) 101A, 101B, 101C, and 101D, herein generically referred to as processor 101. In an embodiment, the computer system 100 contains multiple processors typical of a relatively large system; however, in another embodiment the computer system 100 may alternatively be a single CPU system. Each processor 101 executes instructions stored in the main memory 102 and may include one or more levels of on-board cache.

The main memory 102 is a random-access semiconductor memory for storing data and programs. The main memory 102 is conceptually a single monolithic entity, but in other embodiments the main memory 102 is a more complex arrangement, such as a hierarchy of caches and other memory devices. E.g., memory may exist in multiple levels of caches, and these caches may be further divided by function, so that one cache holds instructions while another holds non-instruction data, which is used by the processor or processors. Memory may further be distributed and associated with different CPUs or sets of CPUs, as is known in any of various so-called non-uniform memory access (NUMA) computer architectures.

The main memory 102 includes an input model 170, a control file 172, behavioral models 174, a controller 176, an output table 178, and simulation engines 180.

The input model 170 is an I/O model, which may be in the SPICE (Simulation Program with Integrated Circuit Emphasis), HSPICE, POWERSPICE, or IBIS (I/O Buffer Information Specification) data formats, but in other embodiments any appropriate data format for the input model 170 may be used.

The control file 172 defines the input model 170 to the controller 176 using a model definition. The model definition enables a generalized format for supplying model-specific information to the controller 176. The following is an example of a driver model definition:

```
MODEL
    MODEL DRIVER_1 (IN-OUT-ENABLE-VDD_CORE-REF)
        ELEMENTS
            DRIVER_R11 = MODEL Technology_IOBook (OUT,
            IN, ENABLE, nrec_out, REF. VDD)
ENDMODEL
```

The behavioral models 174 are generated by the controller 176 and are independent of cycle time (bit time), input pattern, and process points, such as fast, slow, and normal. The simulation engines 180 simulate decks of the input model 170 and the behavioral models 174. The simulation engine 180 further performs characterization simulations for the various manufacturing process and environmental points. In various embodiments, these simulations include the 3 or 5 waveform method, but in other embodiments, any appropriate simulation method may be used. The simulation engines 180 are further described below with reference to FIG. 2.

In an embodiment, the controller 176 includes instructions capable of executing on the CPUs 101 or statements capable of being interpreted by instructions executing on the CPUs 101 to perform the functions as further described below with reference to FIGS. 2, 3, and 4. In another embodiment, the controller 176 may be implemented in microcode. In another embodiment, the controller 176 may be implemented in hardware via logic gates and/or other appropriate hardware techniques.

The output table 178 is generated by the controller 176 and includes the differences between the behavioral models 174, which are output from the controller 176, and the input model 170.

The memory bus 103 provides a data communication path for transferring data among the CPUs 101, the main memory 102, and the I/O bus interface unit 105. The I/O bus interface 105 is further coupled to the system I/O bus 104 for transferring data to and from the various I/O units. The I/O bus interface unit 105 communicates with multiple I/O interface units 111, 112, 113, and 114, which are also known as I/O processors (IOPs) or I/O adapters (IOAs), through the system I/O bus 104. The system I/O bus 104 may be, e.g., an industry standard PCI bus, or any other appropriate bus technology. The I/O interface units support communication with a variety of storage and I/O devices. For example, the terminal interface unit 111 supports the attachment of one or more user terminals 121, 122, 123, and 124. The storage interface unit 112 supports the attachment of one or more direct access storage devices (DASD) 125, 126, and 127 (which are typically rotating magnetic disk drive storage devices, although they could alternatively be other devices, including arrays of disk drives configured to appear as a single large storage device to a host). The I/O and other device interface 113 provides an interface to any of various other input/output devices or devices of other types. Two such devices, the printer 128 and the fax machine 129, are shown in the exemplary embodiment of FIG. 1, but in other embodiment many other such devices may exist, which may be of differing types. The network interface 114 provides one or more communications paths from the computer system 100 to other digital devices and computer systems; such paths may include, e.g., one or more networks 130.

The network 130 may be any suitable network or combination of networks and may support any appropriate protocol suitable for communication of data and/or code to/from the computer system 100. In various embodiments, the network 130 may represent a storage device or a combination of storage devices, either connected directly or indirectly to the computer system 100. In an embodiment, the network 130 may support Infiniband. In another embodiment, the network 130 may support wireless communications. In another embodiment, the network 130 may support hard-wired communications, such as a telephone line or cable. In another embodiment, the network 130 may support the Ethernet IEEE (Institute of Electrical and Electronics Engineers) 802.3x specification. In another embodiment, the network 130 may be the Internet and may support IP (Internet Protocol). In another embodiment, the network 130 may be a local area network (LAN) or a wide area network (WAN). In another embodiment, the network 130 may be a hotspot service provider network. In another embodiment, the network 130 may be an intranet. In another embodiment, the network 130 may be a GPRS (General Packet Radio Service) network. In another embodiment, the network 130 may be a FRS (Family Radio Service) network. In another embodiment, the network 130 may be any appropriate cellular data network or cell-based radio network technology. In another embodiment, the network 130 may be an IEEE 802.11B wireless network. In still another embodiment, the network 130 may be any suitable network or combination of networks. Although one network 130 is shown, in other embodiments any number of networks (of the same or different types) may be present.

Although the memory bus 103 is shown in FIG. 1 as a relatively simple, single bus structure providing a direct communication path among the CPUs 101, the main memory 102, and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, etc. Furthermore, while the I/O bus interface 105 and the I/O bus 104 are shown as single respective units, the computer system 100 may in fact contain multiple I/O bus interface units 105 and/or multiple I/O buses 104. While multiple I/O interface units are shown, which separate the system I/O bus 104 from various communications paths running to the various I/O devices, in other embodiments some or all of the I/O devices are connected directly to one or more system I/O buses.

The computer system 100 depicted in FIG. 1 has multiple attached terminals 121, 122, 123, and 124, such as might be typical of a multi-user "mainframe" computer system. Typically, in such a case the actual number of attached devices is greater than those shown in FIG. 1, although the present invention is not limited to systems of any particular size. The computer system 100 may alternatively be a single-user system, typically containing only a single user display and keyboard input, or might be a server or similar device which has little or no direct user interface, but receives requests from other computer systems (clients). In other embodiments, the computer system 100 may be implemented as a personal computer, portable computer, laptop or notebook computer, PDA (Personal Digital Assistant), tablet computer, pocket computer, telephone, pager, automobile, teleconferencing system, appliance, or any other appropriate type of electronic device.

It should be understood that FIG. 1 is intended to depict the representative major components of the computer system 100 at a high level, that individual components may have greater complexity that represented in FIG. 1, that components other than or in addition to those shown in FIG. 1 may be present, and that the number, type, and configuration of such components may vary. Several particular examples of such additional complexity or additional variations are disclosed herein; it being understood that these are by way of example only and are not necessarily the only such variations.

The various software components illustrated in FIG. 1 and implementing various embodiments of the invention may be implemented in a number of manners, including using various computer software applications, routines, components, programs, objects, modules, data structures, etc., referred to hereinafter as "computer programs," or simply "programs." The computer programs typically comprise one or more instructions that are resident at various times in various memory and storage devices in the computer system 100, and that, when read and executed by one or more CPUs 101 in the computer system 100, cause the computer system 100 to perform the steps necessary to execute steps or elements embodying the various aspects of an embodiment of the invention.

Moreover, while embodiments of the invention have and hereinafter will be described in the context of fully functioning computer systems, the various embodiments of the invention are capable of being distributed as a program product in a variety of forms, and the invention applies equally regardless of the particular type of signal-bearing medium used to actually carry out the distribution. The programs defining the functions of this embodiment may be delivered to the computer system 100 via a variety of signal-bearing media, which include, but are not limited to:

(1) information permanently stored on a non-rewriteable storage medium, e.g., a read-only memory device attached to or within a computer system, such as a CD-ROM readable by a CD-ROM drive;

(2) alterable information stored on a rewriteable storage medium, e.g., a hard disk drive (e.g., DASD 125, 126, or 127) or diskette; or (3) information conveyed to the computer system 100 by a communications medium, such as through a computer or a telephone network, e.g., the network 130, including wireless communications.

Such signal-bearing media, when carrying machine-readable instructions that direct the functions of the present invention, represent embodiments of the present invention.

In addition, various programs described hereinafter may be identified based upon the application for which they are implemented in a specific embodiment of the invention. But, any particular program nomenclature that follows is used merely for convenience, and thus embodiments of the invention should not be limited to use solely in any specific application identified and/or implied by such nomenclature.

The exemplary environments illustrated in FIG. 1 are not intended to limit the present invention. Indeed, other alternative hardware and/or software environments may be used without departing from the scope of the invention.

Figure 2:
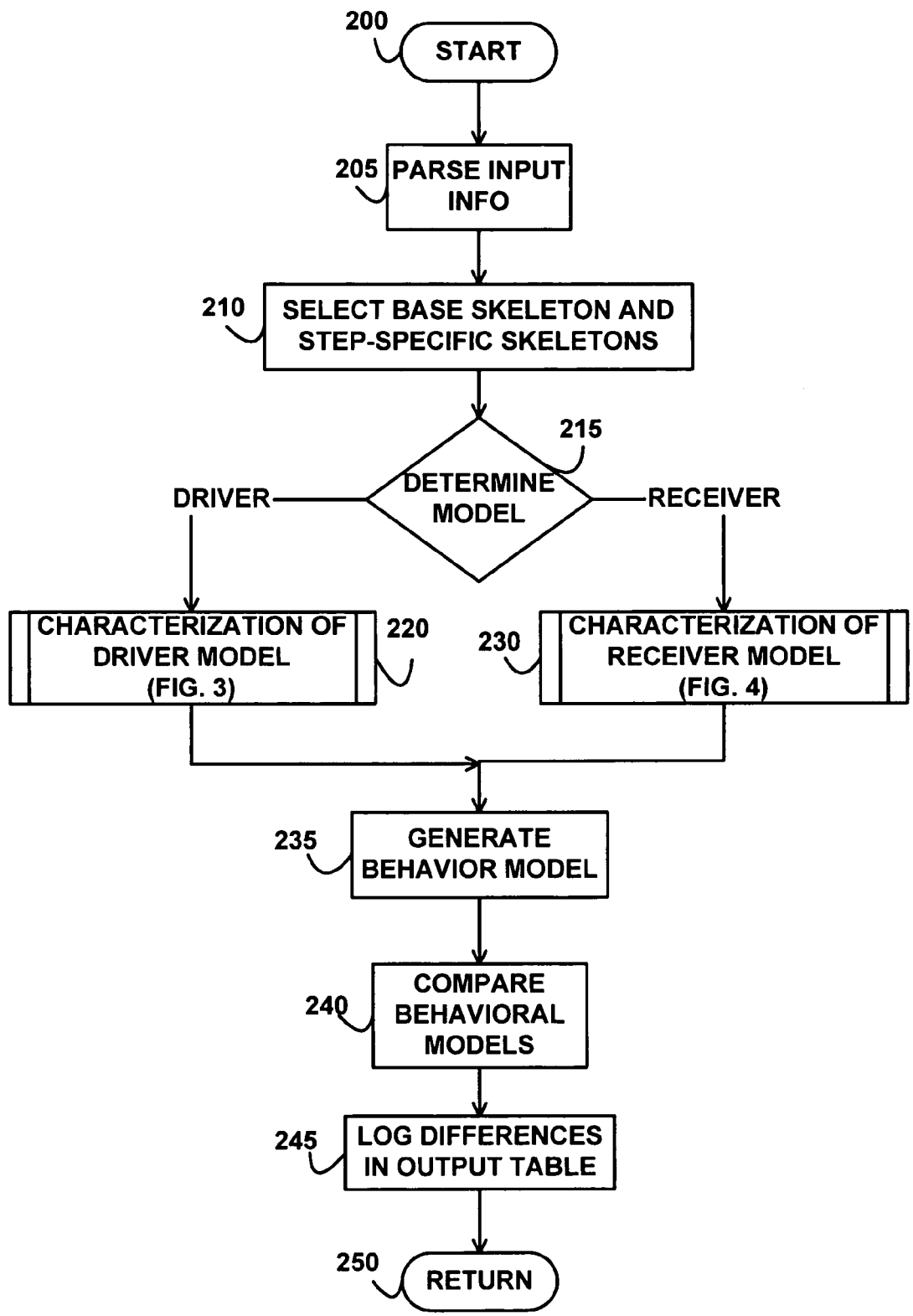
FIG. 2 depicts a high-level flowchart of processing for extracting I/O model parameters, according to an embodiment of the invention.

FIG. 2 depicts a high-level flowchart of processing for extracting I/O model parameters, according to an embodiment of the invention. Control begins at block 200. Control then continues to block 205 where the controller 176 parses input information. The input information specifies the control file 172, which identifies the input model 170 to be characterized. The input information further specifies the simulation engine 180 to be used and the manufacturing variations that are to be supported by the extracted behavioral models 174.

Control then continues to block 210 where the controller 176 selects a base skeleton to set up the simulation environment including process, voltage, temperature, and rise/fall times. The controller 176 further selects a simulator input fragment that supplies each specific characterization step with configuration information depending on which characterization is occurring to a specific model. These simulator input fragments in turn call the models defined in the control file 172 for the characterization simulations. In an embodiment, the simulator input fragment may be implemented as a step-specific skeleton file.

Control then continues to block 215 where the controller 176 determines whether the input model 170 is a driver model or a receiver model. A driver is a set of digital integrated circuit (IC) output ports that drive a multi-conductor interconnect structure loaded by the input ports of other integrated circuits, which are the receivers.

If the input model 170 is a driver model, then control continues to block 220 where the controller 176 characterizes the driver model, as further described below with reference to FIG. 3.

Control then continues to block 235 where the controller 176 generates the behavioral models 174. Control then continues to block 240 where the controller 176 compares the behavioral models 174 to the input model 170 via simulation. The controller 176 performs the comparison by creating a deck containing an identical sample net topology for the input model 170 and the behavioral models 174. The controller 176 then simulates these decks in their respective simulation engines 180 and compares the output from each simulation.

Control then continues to block 245 where the controller 176 quantifies the output from each simulation and logs the differences between the behavioral models 174 and the input model 170 in the output table 178. The controller 176 further logs design parameters, such as input/output current edge slopes and input/output voltage edge slopes.

Control then continues to block 250 where logic of FIG. 2 returns.

If the determination at block 215 determines that the input model 170 is a receiver model, then control continues to block 230 where the controller 176 characterizes the receiver model, as further described below with reference to FIG. 4. Control then continues to block 235, as previously described above.

Figure 3:
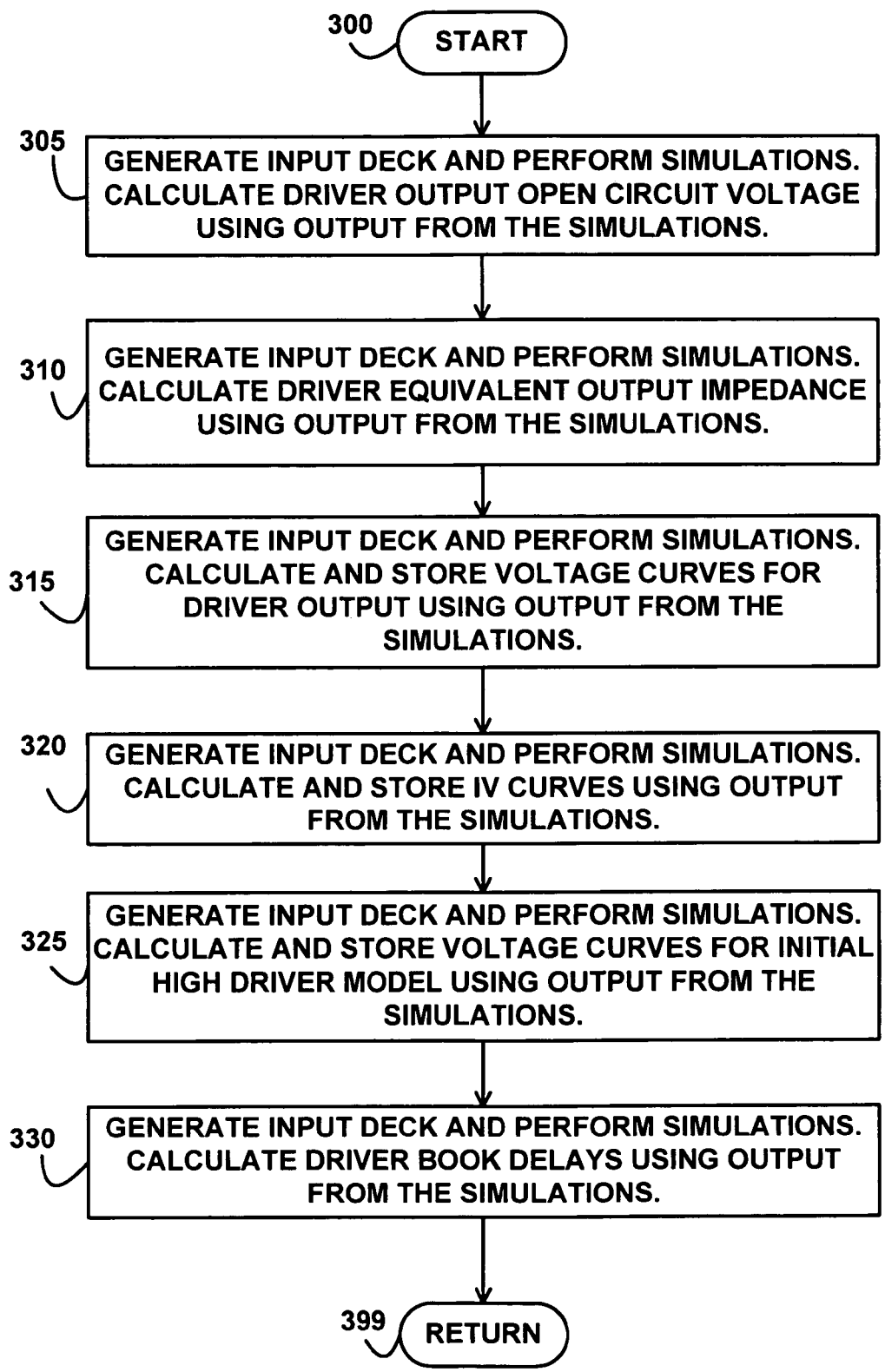
FIG. 3 depicts a high-level flowchart of characterization processing for a driver, according to an embodiment of the invention.

FIG. 3 depicts a high-level flowchart of characterization processing for a driver model, according to another embodiment of the invention. Control begins at block 300. Control then continues to block 305 where the controller 176 generates a simulator input deck for the driver output open circuit voltage. The simulation engine 180 then performs characterization simulations for the driver output and open circuit voltage. The controller 176 then calculates the driver output open circuit voltage from the results of the characterization simulation.

Control then continues to block 310 where the controller 176 generates a simulator input deck for the driver equivalent output impedance. The simulation engine 180 then performs characterization simulations for the driver equivalent output impedance. The controller 176 then calculates the driver equivalent output impedance from the results of the characterization simulation.

Control then continues to block 315 where the controller 176 generates a simulator input deck for the voltage curves for the driver output tied to ground through a load resistor, +Vdd through a load resistor, and −Vdd through a load resistor. The simulation engine 180 then performs characterization simulations for the voltage curves. The controller 176 then calculates and stores the voltage curves from the results of the characterization simulation.

Control then continues to block 320 where the controller 176 generates a simulator input deck for the IV (current-voltage) curves for the driver output. Electronic devices—such as diodes, bipolar junction transistors (BJTs), and field-effect transistors (FETs)—are typically described in terms of their IV curves, which are often plotted with collector current on one axis and collector-to-emitter voltage on another axis. The controller 176 generates IV curves by sweeping a voltage source tied to the driver output from −Vdd to 2Vdd and measuring the current at the driver output: output IV curve for driver input high, output IV curve for driver input low, and output IV curve for driver output in tri-state condition. The simulation engine 180 then performs characterization simulations for the IV curves for the driver output. The controller 176 then calculates and stores the IV curves from the results of the characterization simulation.

Control then continues to block 325 where the controller 176 generates a simulator input deck for voltage curves for the initial high driver model. The simulation engine 180 then performs characterization simulations for the voltage curves. The controller 176 then calculates and stores the voltage curves from the results of the characterization simulation.

Control then continues to block 330 where the controller 176 generates a simulator input deck for driver book delays. The simulation engine 180 then performs characterization simulations for the driver book delays. The controller 176 then calculates and stores the driver book delays from the results of the characterization simulation.

Control then continues to block 399 where the logic of FIG. 3 returns.

Figure 4:
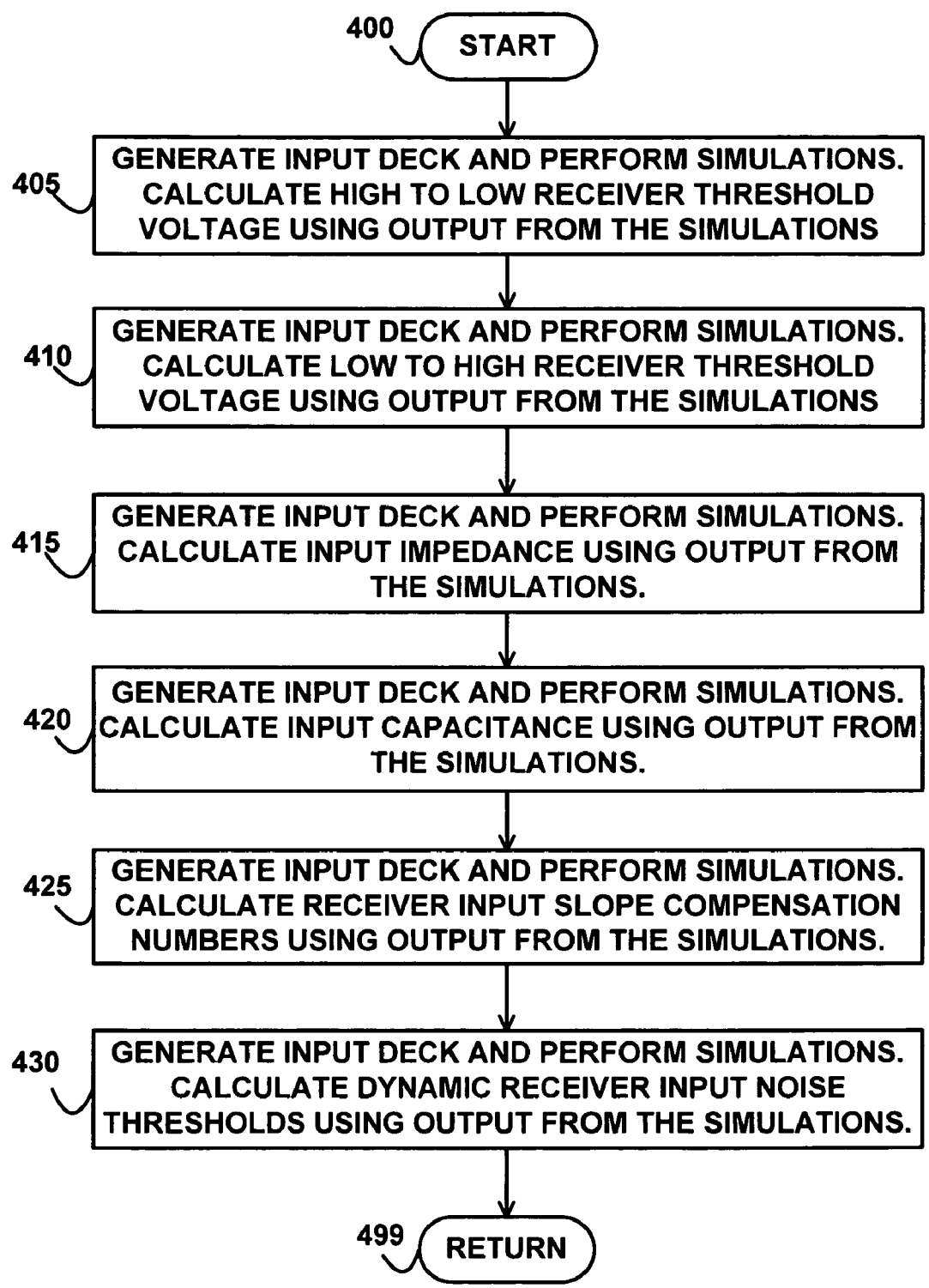
FIG. 4 depicts a high-level flowchart of characterization processing for a receiver, according to an embodiment of the invention.

FIG. 4 depicts a high-level flowchart of characterization processing for a receiver model, according to an embodiment of the invention. Control begins at block 400. Control then continues to block 405 where the controller 176 generates a simulator input deck for the high-to-low receiver threshold voltage of the receiver model. The simulation engine 180 then performs characterization simulations for the high-to-low receiver threshold voltage. The controller 176 then calculates the high-to-low receiver threshold voltage of the receiver model from the results of the characterization simulation.

Control then continues to block 410 where the controller 176 generates a simulator input deck for the low-to-high receiver threshold voltage of the receiver model. The simulation engine 180 then performs characterization simulations for the low-to-high receiver threshold voltage. The controller 176 then calculates the low-to-high receiver threshold voltage of the receiver model from the results of the characterization simulation.

Control then continues to block 415 where the controller 176 generates a simulator input deck for the input impedance of the receiver model. The simulation engine 180 then performs characterization simulations for the input impedance. The controller 176 then calculates the input impedance of the receiver model from the results of the characterization simulation.

Control then continues to block 420 where the controller 176 generates a simulator input deck for the input capacitance of the receiver model. The simulation engine 180 then performs characterization simulations for the input capacitance. The controller 176 then calculates the input capacitance of the receiver model from the results of the characterization simulation.

Control then continues to block 425 where the controller 176 generates a simulator input deck for the receiver input slope compensation numbers. The simulation engine 180 then performs characterization simulations for the receiver input slope. The controller 176 then calculates the receiver input slope compensation numbers from the results of the characterization simulation.

Control then continues to block 430 where the controller 176 generates a simulator input deck for the dynamic receiver input noise thresholds for specific rising noise pulse width values. The simulation engine 180 then performs characterization simulations for the dynamic receiver input noise thresholds. The controller 176 then calculates the dynamic receiver input noise thresholds for specific rising noise pulse width values from the results of the characterization simulation.

Control then continues to block 499 where the logic of FIG. 4 returns.

In the previous detailed description of exemplary embodiments of the invention, reference was made to the accompanying Drawing (where like numbers represent like elements), which forms a part hereof, and in which is shown by way of illustration specific exemplary embodiments in which the invention may be practiced. These embodiments were described in sufficient detail to enable those skilled in the art to practice the invention, but other embodiments may be utilized and logical, mechanical, electrical, and other changes may be made without departing from the scope of the present invention. Different instances of the word "embodiment" as used within this specification do not necessarily refer to the same embodiment, but they may. The previous detailed description is, therefore, not to be taken in a limiting sense, and the scope of the present invention is defined only by the appended claims.

In the previous description, numerous specific details were set forth to provide a thorough understanding of embodiments of the invention. But, the invention may be practiced without these specific details. In other instances, well-known circuits, structures, and techniques have not been shown in detail in order not to obscure the invention.

We claim:

1. A method comprising:
   determining that an I/O model is a driver model;
   characterizing the I/O model, wherein the characterizing further comprises performing a simulation of driver output circuit voltage;
   creating a set of behavioral models based on the characterizing, wherein the behavioral models are independent of cycle time, input pattern, and process points; and
   comparing the set of behavioral models to the I/O model.

2. The method of claim 1, further comprising:
   selecting a simulator input fragment for the characterizing.

3. The method of claim 1, further comprising:
   calculating a driver equivalent output impedance.

4. The method of claim 1, wherein the comparing further comprises:
   creating decks comprising a net topology for the I/O model and the set of behavioral models;
   simulating the decks; and
   comparing output from the simulating.

5. An apparatus comprising:
   means for determining that an I/O model is a driver model;
   means for selecting a simulator input fragment;
   means for characterizing the I/O model using the simulator input fragment, wherein the means for characterizing further comprises means for performing a simulation of driver output open circuit voltage;
   means for creating a set of behavioral models based on the characterizing, wherein the behavioral models are independent of cycle time, input pattern, and process points; and
   means for comparing the set of behavioral models to the I/O model.

6. The apparatus of claim 5, wherein the means for comparing further comprises:
   means for creating decks comprising a net topology for the I/O model and the set of behavioral models;
   means for simulating the decks; and
   means for comparing output from the simulating.

7. The apparatus of claim 5, wherein the means for characterizing further comprises:
   means for calculating current-voltage curves for driver output.

8. The apparatus of claim 5, wherein the means for characterizing further comprises:
   means for calculating voltage curves for an initial high driver model.

9. The apparatus of claim 5, wherein the means for characterizing further comprises:
   means for calculating driver book delays.

10. A signal-bearing medium encoded with instructions, wherein the instructions when executed comprise:
    determining that an I/O model is a receiver model;
    selecting a simulator input fragment;
    characterizing the I/O mode using the simulator input fragment, wherein the characterizing further comprises calculating a high-to-low receiver threshold voltage of the receiver model;
    creating a set of behavioral models based on the characterizing, wherein the behavioral models are independent of cycle time, input pattern, and process points; and
    comparing the set of behavioral models to the I/O model, wherein the comparing further comprises:
      creating decks comprising a met topology for the I/O model and the set of behavioral models,
      simulating the decks, and
      comparing output from the simulating.

11. The signal-bearing medium of claim 10, wherein the characterizing further comprises:
    calculating a low-to-high receiver threshold voltage.

12. The signal-bearing medium of claim 10, wherein the characterizing further comprises:
    calculating input impedance.

13. The signal-bearing medium of claim 10, wherein the characterizing further comprises:
    calculating input capacitance.

14. A computer system comprising:
    a processor; and
    a storage device encoded with instructions, wherein the instructions when executed on the processor comprise:
      determining that an I/O model is a receiver model;
      selecting a simulator input fragment comprising configuration information,
      characterizing the I/O model using the simulator input fragment, wherein the characterizing further comprises calculating a high-to-low receiver threshold voltage of the receiver model,
      creating a set of behavioral models based on the characterizing, wherein the behavioral models are independent of cycle time, input pattern, and process points, and
      comparing the set of behavioral models to the I/O model, wherein the comparing further comprises:
        creating decks comprising a net topology for the I/O model and the set of behavioral models,
        simulating the decks, and
        comparing output from the simulating.

15. The computer system of claim 14, wherein the characterizing further comprises:
    calculating receiver input slop compensation numbers.

16. The computer system of claim 14, wherein the characterizing further comprises:
    calculating dynamic receiver input noise thresholds.

17. The computer system of claim 14, wherein the instructions further comprise:
    selecting a base skeleton file comprising process, voltage, temperature, and rise/fall times.

* * * * *